United States Patent [19]

Chuang

[11] Patent Number: 4,469,979
[45] Date of Patent: Sep. 4, 1984

[54] MICRORESONATOR OF DOUBLE-ENDED TUNING FORK CONFIGURATION

[75] Inventor: Shih S. Chuang, Irvine, Calif.

[73] Assignee: Statek Corporation, Orange, Calif.

[21] Appl. No.: 498,768

[22] Filed: May 27, 1983

[51] Int. Cl.³ .................................. H01L 41/04
[52] U.S. Cl. ..................... 310/370; 310/367
[58] Field of Search ............. 310/345, 346, 348, 360, 310/370, 334, 361, 367, 368, 370; 73/517 AV, 862.59, DIG. 4, 1; 331/40, 48, 65, 156

[56] References Cited

U.S. PATENT DOCUMENTS

| | | | |
|---|---|---|---|
| 3,601,639 | 8/1971 | Hannon et al. | 310/366 |
| 4,215,570 | 8/1980 | Eernisse | 73/141 R |
| 4,299,122 | 11/1981 | Ueda et al. | 73/862.59 |
| 4,356,425 | 10/1982 | Kagure et al. | 310/370 |
| 4,388,548 | 6/1983 | Vangheluwe | 310/365 |
| 4,415,827 | 11/1983 | Chuange | 310/370 |

FOREIGN PATENT DOCUMENTS

| | | | |
|---|---|---|---|
| 54-37488 | 3/1979 | Japan | 310/370 |
| 55-74414 | 6/1980 | Japan | 310/367 |

Primary Examiner—J. D. Miller
Assistant Examiner—D. L. Rebsch
Attorney, Agent, or Firm—Spensley, Horn, Jubas & Lubitz

[57] ABSTRACT

In a quartz crystal microresonator of the type including first and second stem portions, a pair of integral tines extending between the stem portions, a slot between the tines, the slot having opposed crotches where the tines join the stem portions, and a plurality of electrodes mounted on each of the tines, spaced along the lengths thereof, the electrodes being adapted for receipt of an AC voltage for causing the tines to oscillate, there are disclosed several different electrode configurations to optimize resonator performance when operating in the fundamental and first and second overtone flexure modes. The electrodes change polarity along the length of the tines at points where the second derivative of displacement changes polarity.

11 Claims, 10 Drawing Figures

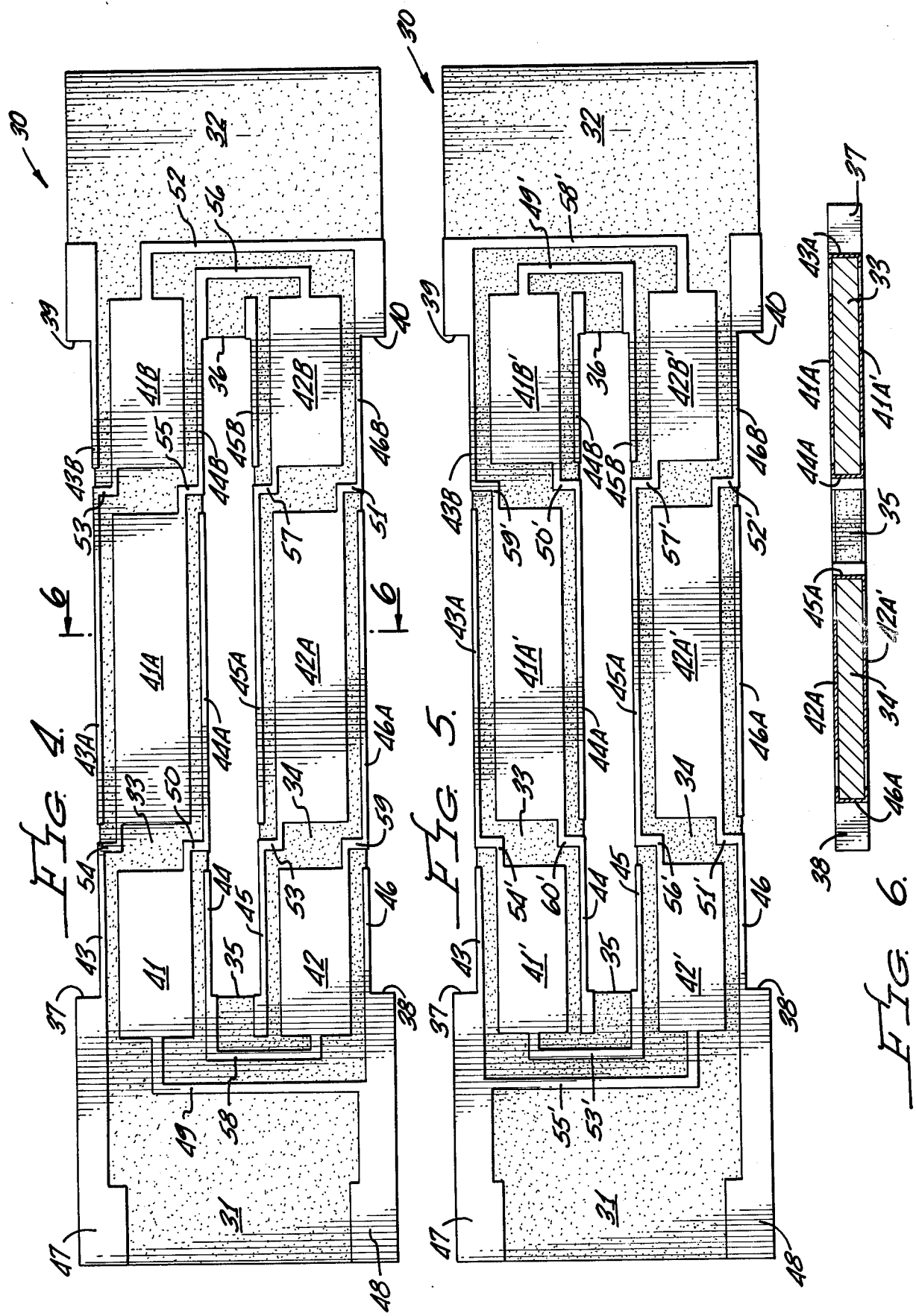

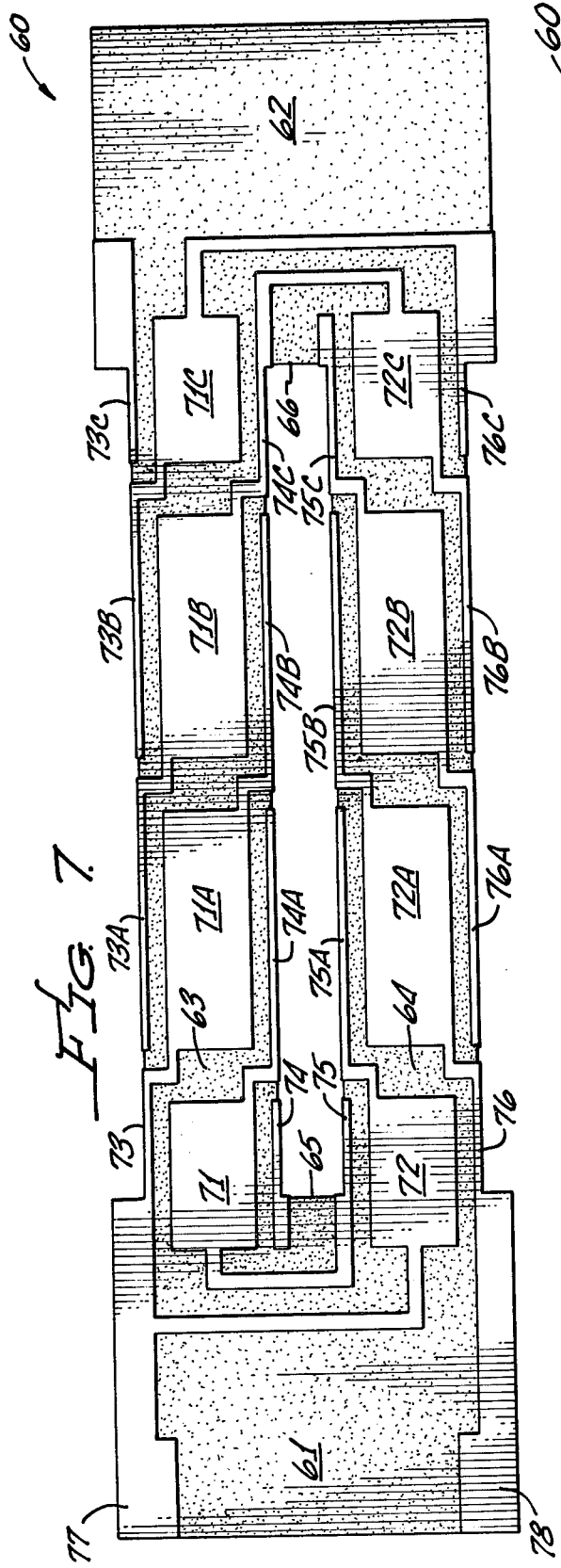
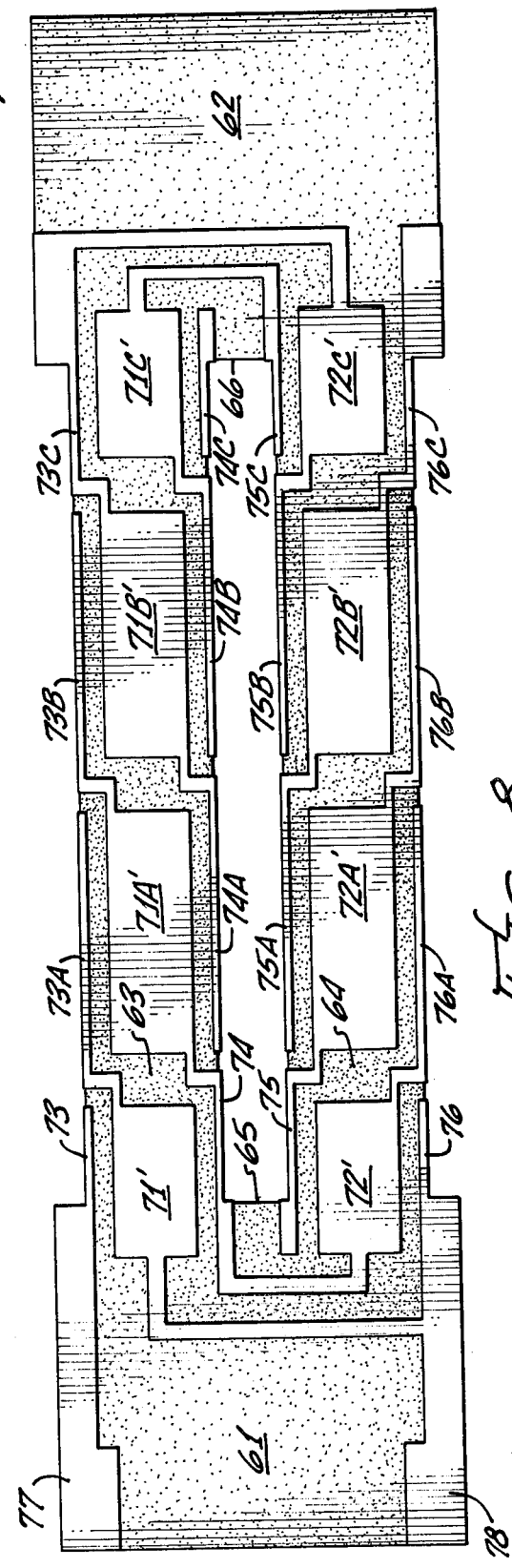

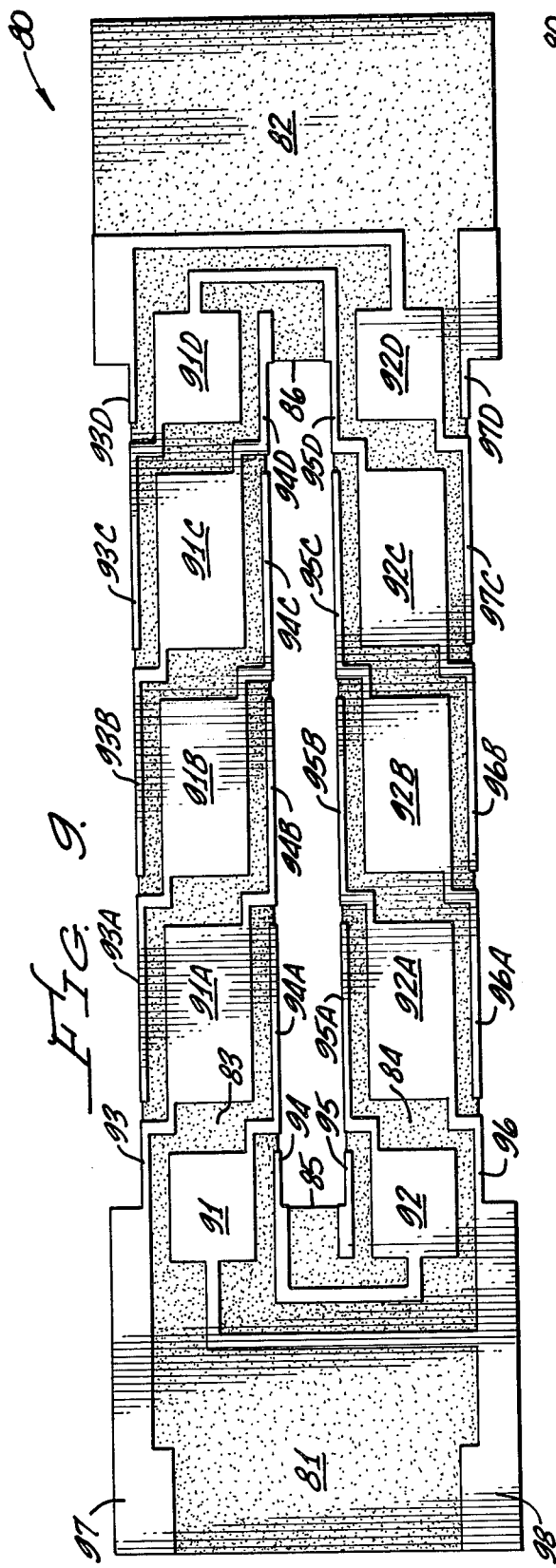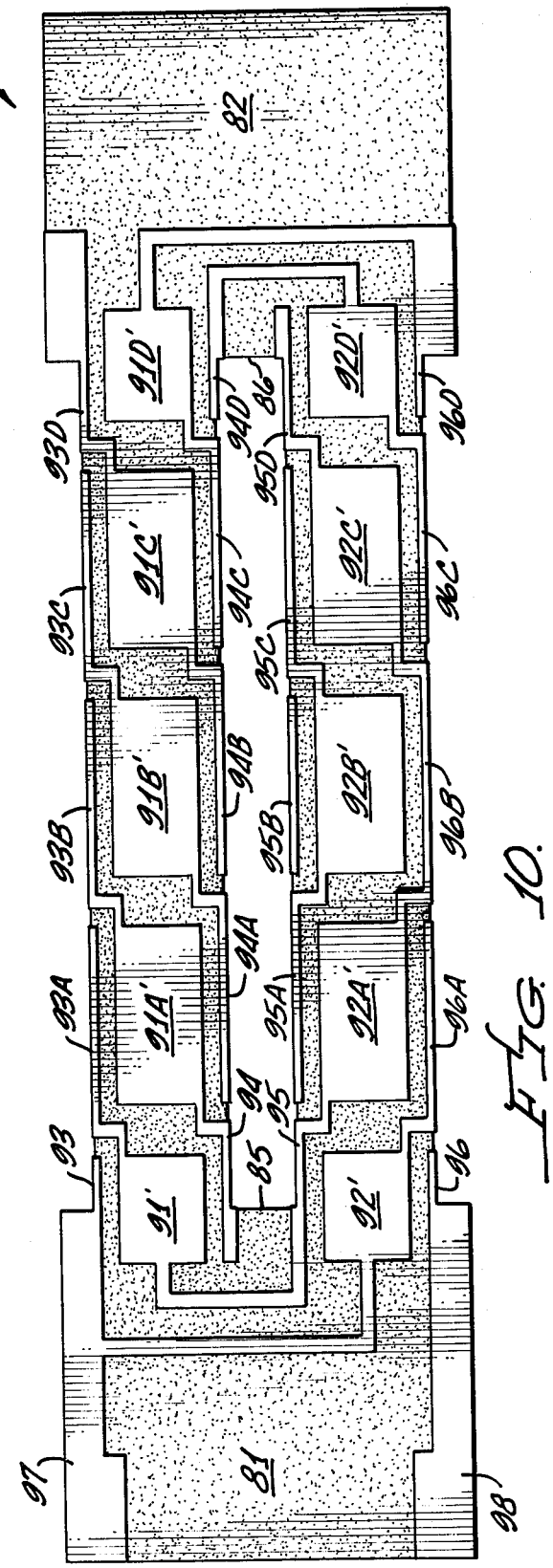

MICRORESONATOR OF DOUBLE-ENDED TUNING FORK CONFIGURATION

BACKGROUND OF THE INVENTION

1. Field of the Invention

The present invention relates to a microresonator having a double-ended tuning fork configuration and, more particularly, to such a microresonator having a preferred geometry and electrode configuration to optimize resonator performance when operating in the fundamental and first and second overtone flexure modes.

2. Description of the Prior Art

Piezoelectric resonators have been known since at least the early 1940's when work completed at Bell Laboratories was reported. Over the years, such devices have been made smaller and smaller to facilitate their use as accurate signal sources, such as in time measuring devices. Microresonators are now commonly made from piezoelectric materials such as quartz, as shown in U.S. Pat. Nos. 3,488,530, 3,969,640 and 3,766,616, issued to Juergen H. Staudte. The application of microphotolithographic processes developed in the integrated electronic circuit industry has permitted high volume manufacture of microresonators small enough for incorporation into ladie's wristwatches.

One common configuration of a quartz crystal microresonator is the so-called double-ended tuning fork which may be likened to two tuning forks secured end to end. Double ended tuning forks have been proposed for a variety of uses, including use in a beat frequency oscillator (U.S. Pat. No. 2,854,581), use as an ultrasonic transducer with feedback control (U.S. Pat. No. 3,148,289), use as an accelerometer element (U.S. Pat. No. 3,238,789), and use as a force transducer (U.S. Pat. Nos. 4,215,570; 4,299,122; 4,372,173; and 4,321,500).

Using photolithographic chemical etching manufacturing techniques, better control in the precision of crystal geometrical dimensions is provided. These techniques also create more flexibility for a crystal designer to use more complex crystal geometries to optimize the double-ended tuning fork quartz crystal parameters. However, while double-ended tuning fork quartz crystals have been known and are potentially useful in many sensor applications, there are no published detailed designs which optimize resonator parameters.

SUMMARY OF THE INVENTION

According to the present invention, there is disclosed different designs and different results achievable using a double-ended tuning fork quartz crystal vibrating in the fundamental and overtone flexure modes. Such a crystal is not only useful as a force sensor, but is also useful in frequency control and filter applications. The motions of the fundamental and overtone flexure modes of a double-ended tuning fork are described. Electrode designs which depend on the crystal vibrational mode are used to optimize crystal parameters.

Briefly, in a quartz crystal microresonator of the type including first and second stem portions, a pair of integral tines extending between the stem portions, a slot between the tines, the slot having opposed crotches where the tines join the stem portions, and a plurality of electrodes mounted on each of the tines, spaced along the lengths thereof, the electrodes receiving an AC voltage for causing the tines to oscillate, there are disclosed several electrode configurations to optimize crystal parameters.

According to the invention, the crystal orientation is $(ZYw)\theta$ and the electrodes are mounted on the tines such that the polarity of the electrodes changes along the length of the tines at points derived by determining where the second derivative of the lateral displacement of the tines with respect to length changes polarity. $\theta$ is preferably, but not necessarily, within the range of $\pm 20°$. Each tine has a plurality of sets of electrodes thereon where the electrodes in each set are mounted on the top, bottom and side surfaces of the tines.

OBJECTS, FEATURES AND ADVANTAGES

It is the object of the present invention to provide a detailed understanding of the operation of a double-ended tuning fork quartz crystal. It is a feature of the present invention to achieve this object by providing a plurality of electrode designs and parameters. An advantage to be derived is that crystal parameters can be optimized. Another advantage is that a highly useful double-ended tuning fork may be constructed. A still further advantage is that a double-ended tuning fork can be operated in the fundamental or overtone flexure modes.

Still other objects, features, and attendant advantages of the present invention will become apparent to those skilled in the art from a reading of the following detailed description of the preferred embodiments constructed in accordance therewith, taken in conjunction with the accompanying drawings wherein like numerals designate like or corresponding parts in the several figures and wherein:

BRIEF DESCRIPTION OF THE DRAWINGS

FIG. 4 is a top plan view of a microresonator of double-ended tuning fork configuration constructed in accordance with a first embodiment of the present invention, operating in the fundamental mode, and showing the electrodes on the top surface thereof;

FIG. 5 is a top plan view of the microresonator of FIG. 4 and showing the electrodes on the bottom surface thereof;

FIG. 6 is a sectional view taken along line 6—6 in FIG. 4;

FIG. 7 is a top plan view of a microresonator of double-ended tuning fork configuration constructed in accordance with a second embodiment of the present invention, operating in the first overtone mode, and showing the electrodes on the top surface thereof;

FIG. 8 is a top plan view of the microresonator of FIG. 7 and showing the electrodes on the bottom surface thereof;

FIG. 9 is a top plan view of a microresonator of double-ended tuning fork configuration constructed in accordance with a third embodiment of the present invention, operating in the second overtone mode, and showing the electrodes on the top surface thereof; and FIG. 10 is a top plan view of the microresonator of FIG. 9 and showing the electrodes on the bottom surface thereof.

DESCRIPTION OF THE PREFERRED EMBODIMENT

Figure 1:
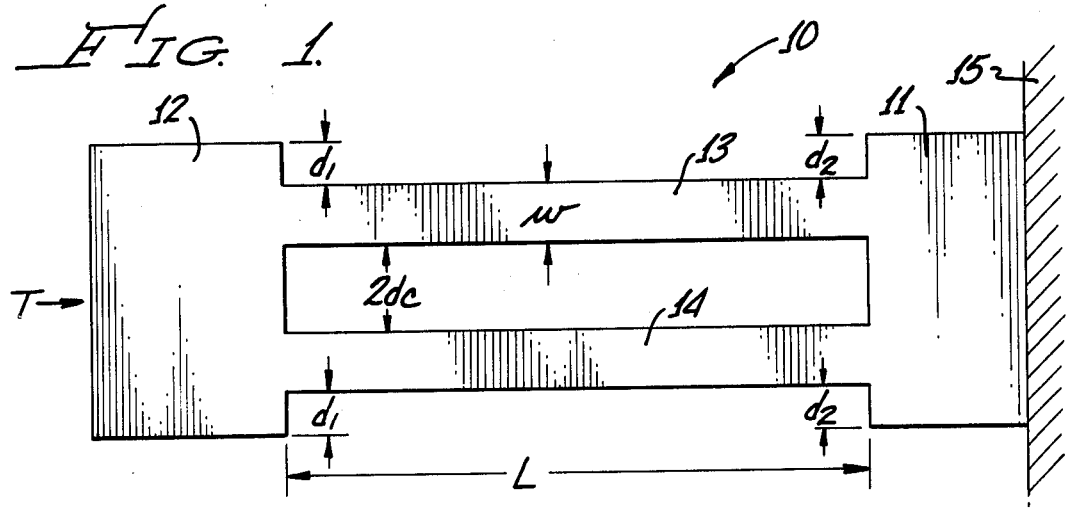
FIG. 1 is a simplified plan view of a microresonator having a double-ended tuning fork configuration according to the teachings of the present invention.

Referring now to the drawings and, more particularly, to FIG. 1 thereof, there is shown the general configuration of a typical double-ended tuning fork structure, generally designated 10. A double-ended tuning fork is a flat, piezoelectric element comprising opposed rectangular stem portions 11 and 12, between which extend integral tines 13 and 14. Stem portion 11 is clamped to a suitable support 15 whereas stem portion 12 is subject to a force T. Each tine has a length L, a width w and a thickness t. Other attributes of double-ended tuning fork 10 will be discussed more fully hereinafter.

It is not a simple matter to analyze and obtain a complete analytic function to describe the flexure motion of double-ended tuning fork 10. In practice, the results of the analysis of the flexure motion of a beam clamped on both ends can provide essential important information on the motion of tines 13 and 14 and the frequency of tuning fork 10 for a first approximation. Using such an analysis, the relative displacement of each tine 13 and 14 as a function of the position along the tine length direction can approximately be described by the following equation:

$$U(X_1) = P\left[\left(\cosh m\frac{X_1}{L} - \cos m\frac{X_1}{L}\right) - \left(\sinh m\frac{X_1}{L} - \sin m\frac{X_1}{L}\right)\right] \quad (1)$$

where
P = (sinh m − sin m)/(cosh m − cos m)
$X_1$ = position along the tine length, and
m is a constant which is derived from the equation:

$$(\cosh m)\cdot(\cos m) = 1 \quad (2)$$

For different flexure modes, m has the following values:

| flexure mode | m |
| --- | --- |
| fundamental | 4.73 |
| first overtone | 7.86 |
| second overtone | 10.99 |

Figure 2:
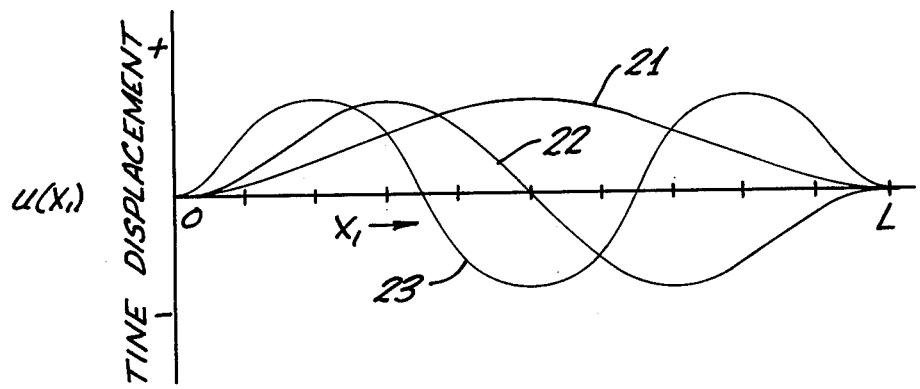
FIG. 2 is a series of curves showing tine relative lateral displacement as a function of position along the length of each tine.

FIG. 2 shows the relative lateral displacement $U(X_1)$ of tines 13 and 14 for the fundamental and first and second overtone flexure modes as a function of position $X_1$ along the length of each tine. Curve 21 shows tine displacement for the fundamental mode, curve 22 shows tine displacement for the first overtone mode and curve 23 shows tine displacement for the second overtone mode.

The frequency f of the flexure motion is approximately:

$$f = f_m(1 + \alpha T)^{\frac{1}{2}} \quad (3)$$

where $f_m$ is the frequency of the flexure motion without an external applied force and is given by the equation:

$$f_m = \frac{1}{2\pi}\sqrt{\frac{1}{12\rho S}} \cdot \frac{m^2 w}{L^2}\left[1 + K_{cm}\left(\frac{w}{L}\right)^2\right] \quad (4)$$

and
ρ = mass density,
S = elastic compliance constant,
T = external applied force on the crystal along the length direction,
w = tine width,
L = tine length from crotch to crotch,
t = tine thickness,
α = frequency-force constant and
$K_{cm}$ = a constant.

When no external force is applied to double-ended tuning fork 10 and L/W is very small, the frequency ratios of the overtone flexure modes, with respect to the fundamental flexure mode, are approximately 2.8 and 5.4, respectively, for the first and second overtone flexure modes. Equation (3) shows that the frequency of a double-ended tuning fork crystal can be changed by the external force T.

Electrodes are placed on a piezoelectric resonator to obtain the maximum electrical/mechanical coupling. In the case of a double-ended tuning fork quartz crystal, the electrode design will depend on its geometry and the crystal orientation. According to the present invention, the crystal orientation is (ZYw)θ, i.e., the tine length is almost in the Y direction and the width is in the X direction. θ is preferably, but not necessarily, within the range of ±20°. In this case, the electric field which will contribute to the piezoelectric effect is mainly from the field in the X direction. It can be shown that the stress related to the piezoelectric effect is approximately proportional to the second derivative $U''(x_1)$ of the lateral displacement $U(X_1)$ of the tine with respect to $X_1$.

Figure 3:
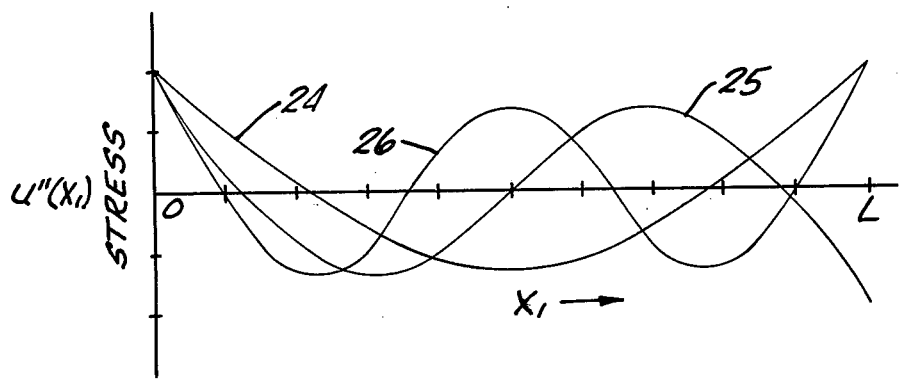
FIG. 3 is a series of curves showing relative stress as a function of position along the length of each tine.

FIG. 3 shows the relative stress $U''(X_1)$ as a function of position $X_1$ along the tine length direction for the fundamental and overtone flexure modes. Curve 24 is for the fundamental mode, curve 25 is for the first overtone mode and curve 26 is for the second overtone mode. The nodal points shown in FIG. 3 will be the approximate locations in a practical double-ended tuning fork. The actual locations will depend on the detailed geometry of the crystal. However, the locations shown in FIG. 3 provide the initial positions for the design.

FIGS. 4-6 show the electrode pattern for a double-ended tuning fork operating in the fundamental mode according to a first embodiment of the invention. Since, as shown by curve 24 in FIG. 3, there are two reverses in the stress pattern along the length of the tines, two electrical polarity changes of the electrodes along the tines is necessary. The positions where the polarity of the electrodes changes are at the minimum or zero stress points along the length of the tines.

Referring now to FIGS. 4-6, it will be seen that a flat, piezoelectric tuning fork, generally designated 30, comprises stem portions 31 and 32, between which extend a pair of integral tines 33 and 34. Each tine has a length L which extends from a crotch 35 to a crotch 36. For reasons which will appear more fully hereinafter, the intersections between each tine and stem portions 31 and 32 form shoulders 37–40, shoulders 37 and 38 being aligned with crotch 35 and shoulders 39 and 40 being aligned with crotch 36.

Those skilled in the art will appreciate that the various electrodes and interconnections now to be described may be deposited directly on stems 31 and 32 and tines 33 and 34 using microphotolithographic processes.

Adjacent stem 31, electrodes 41 and 42 are deposited on the top surface of tines 33 and 34, respectively, electrodes 41 and 42 extending onto stem 31. Corresponding electrodes 41' and 42' extend along the bottom surface of tines 33 and 34, respectively. Electrodes 43 and 44 extend along opposite sides of tine 33, between electrodes 41 and 41' and electrodes 45 and 46 extend along opposite sides of tine 34, between electrodes 42 and 42'.

A similar arrangement of electrodes are centrally mounted on tines 33 and 34 and at the other ends of tines 33 and 34. These electrodes have been given the same numbers, to which have been added the suffixes A and B. It will be particularly noted that the electrodes are positioned so that the polarity of the electrodes changes at the zero stress points. In this configuration, the zero stress points are at a distance .22L from crotches 35 and 36.

In order to apply a driving voltage to the electrodes, terminal pads 47 and 48 are provided on stem 31, between which an AC voltage is applied. Terminal pad 48 is connected directly to electrode 46 and to electrode 41 by means of a conductor 49. Electrode 41 is connected to electrode 44A by a conductor 50, electrode 44A being connected to electrode 41B' by a conductor 50'. Electrode 41B' is connected to electrode 45B by a conductor 49'.

Electrode 46 is connected to electrode 42A' by a conductor 51', electrode 42A' being connected to electrode 46B by a conductor 52'. Electrode 46B is connected to electrode 42A by a conductor 51 and to electrode 41B by a conductor 52. Electrode 42A is connected to electrode 45 by a conductor 53, electrode 45 being connected to electrode 41' by a conductor 53'. Electrode 41' is connected to electrode 43A by a conductor 54', electrode 43A also being connected to electrode 41B by a conductor 53. In this manner, electrodes 41, 41B, 41', 41B', 42A, 42A', 43A, 44A, 45, 45B, 46 and 46B are all interconnected and connected to terminal pad 48.

Pad 47 is connected directly to electrode 43 and by a conductor 55' to electrode 42'. Electrode 43 is connected by a conductor 54 to electrode 41A which is connected by a conductor 55 to electrode 44B. Electrode 44B is connected by a conductor 56 to electrode 42B which is connected by a conductor 57 to electrode 45A. Electrode 45A is connected by means of a conductor 56' to electrode 42'.

Electrode 45A is also connected by means of a conductor 57' to electrode 42B' which is connected by a conductor 58' to electrode 43B. Electrode 43B is connected by a conductor 59' to electrode 41A' which is connected by means of a conductor 60' to electrode 44. Electrode 44 is connected by a conductor 58 to electrode 42 which is connected by means of a conductor 59 to electrode 46A. In this manner, electrodes 41A, 41A', 42, 42B, 42', 42B', 43, 43B, 44, 44B, 45A and 46A are all interconnected and connected to terminal pad 47. Because of the locations and interconnections of the electrodes just described, application of an AC voltage to pads 47 and 48 will cause the electrodes connected to pad 47 to assume one polarity and the remaining electrodes connected to pad 48 to assume the opposite polarity. In response, tines 33 and 34 will vibrate in the fundamental mode as shown by curve 21 in FIG. 2.

While three sets of electrodes are shown on each of tines 33 and 34, each set including four electrodes mounted on the top, bottom and side surfaces thereof, all three sets are not necessarily required to cause vibration in the fundamental mode. Excitation can be accomplished with the middle set only or the outer two sets only.

FIGS. 7 and 8 show the electrode patterns for a double-ended tuning fork operating in the first overtone mode according to a second embodiment of the invention. Since, as shown by curve 25 in FIG. 3, there are three reverses in the stress pattern along the length of the tines, three polarity changes of the electrodes along the tines is necessary. In this configuration too, the positions where the polarity of the electrodes changes are at the minimum or zero stress points along the length of the tines.

Referring now to FIGS. 7 and 8, it will be seen that a flat, piezoelectric, double-ended tuning fork, generally designated 60, comprises stem portions 61 and 62, between which extend a pair of integral tines 63 and 64. Each tine has a length L which extends from a crotch 65 to a crotch 66. Tines 63 and 64 also have shoulders, as described with regard to tuning fork 30.

It will be readily appreciated by those skilled in the art that the general arrangement of tuning fork 60 is similar to that of tuning fork 30, except that there are four sets of electrodes on each tine, instead of three, with the spaces between the electrodes aligned with the zero stress points, where curve 25 intersects the zero stress line in FIG. 3. Thus, the top surface of tine 63 includes electrodes 71, 71A, 71B and 71C, the bottom surface of tine 63 includes electrodes 71', 71A', 71B' and 71C', the top surface of tine 64 includes electrodes 72, 72A, 72B and 72C, and the bottom surface of tine 64 includes electrodes 72', 72', 72B' and 72C'. Tine 63 includes electrodes 73, 73A, 73B and 73C on one side thereof and electrodes 74, 74A, 74B and 74C on the opposite side thereof. Tine 64 has electrodes 75, 75A, 75B and 75C on one side thereof and electrodes 76, 76A, 76B and 76C on the other side thereof.

Double-ended tuning fork 60 includes terminal pads 77 and 78, between which an AC voltage is applied. Terminal pad 77 is connected by suitable conductors, as shown, to electrodes 71A, 71C, 71A', 71C', 72, 72B, 72', 72B', 73, 73B, 74, 74B, 75A, 75C, 76A and 76C. Terminal pad 78 is connected by suitable conductors, as shown, to electrodes 71, 71B, 71', 71B', 72A, 72C, 72A', 72C', 73A, 73C, 74A, 74C, 75, 75B, 76 and 76B. Because of the locations and intersections of the electrodes just described, application of an AC voltage between pads 77 and 78 will cause the electrodes connected to pads 77 and 78 to assume opposite polarities. In response, tines 63 and 64 will move in opposite directions in accordance with the pattern shown by curve 22 in FIG. 2.

While four sets of electrodes are shown on each of tines 63 and 64, each set including four electrodes mounted on the top, bottom and side surfaces thereof, all four sets are not necessarily required to cause vibration in the first overtone mode. Excitation can be accomplished with the first and third sets or the second and fourth sets only.

FIGS. 9 and 10 show the electrode pattern for a double-ended tuning fork operating in the second overtone mode according to a third embodiment of the invention. Since, as shown by curve 26 in FIG. 3, there are four reverses in the stress pattern along the length of the tines, four electrode polarity changes along the tines are necessary. In this configuration too, the positions where the polarity of the electrodes changes are at the minimum or zero stress points along the length of the tines.

Referring now to FIGS. 9 and 10, it will be seen that a flat, piezoelectric double-ended tuning fork, generally designated 80, comprises stem portions 81 and 82, between which extend a pair of integral tines 83 and 84. Each tine has a length L which extends from a crotch 85 to a crotch 86. Tines 83 and 84 also have shoulders, as described with regard to tuning fork 30.

It will be readily appreciated by those skilled in the art that the general arrangement of tuning fork 80 is similar to that of tuning fork 30, except that there are five sets of electrodes on each tine, instead of three, with the spaces between the electrodes aligned with the zero stress points, where curve 26 intersects the zero stress line in FIG. 3. Thus, the top surface of tine 83 includes electrodes 91, 91A, 91B, 91C and 91D, the bottom surface of tine 83 includes electrodes 91', 91A', 91B, 91C' and 91D', the top surface of tine 84 includes electrodes 92, 92A, 92B, 92C and 92D and the bottom surface of tine 84 includes electrodes 92', 92A', 92B', 92C', and 92D'. Tine 83 includes electrodes 93, 93A, 93B, 93C and 93D on one side thereof and electrodes 94, 94A, 94B, 94C and 94D on the opposite side thereof. Tine 84 includes electrodes 95, 95A, 95B, 95C and 95D on one side thereof and electrodes 96, 96A, 96B, 96C and 96D on the other side thereof.

Double-ended tuning fork 80 includes terminal pads 97 and 98, between which an AC voltage is applied. Terminal pad 97 is connected by suitable connductors, as shown, to electrodes 91A, 91C, 91A', 91C', 92, 92B, 92D, 92', 92B', 92D', 93, 93B, 93D, 94, 94B, 94D, 95A, 95C, 96A and 96C. Terminal pad 98 is connected by suitable conductors, as shown, to electrodes 91, 91B, 91D, 91', 91B', 91D', 92A, 92C, 92A', 92C', 93A, 93C, 94A, 94C, 95, 95B, 95D, 96, 96B, and 96D. Because of the locations and intersections of the electrodes just described, application of an AC voltage between terminal pads 97 and 98 will cause the electrodes connected to pads 97 and 98 to assume opposite polarities. In response, tines 83 and 84 will move in opposite directions, in accordance with the pattern shown by curve 23 in FIG. 2.

While five sets of electrodes are shown on each of tines 83 and 84, each set including four electrodes mounted on the top, bottom and side surfaces thereof, all five sets are not necessarily required to cause vibration in the second overtone mode. Excitation can be accomplished with the second and fourth sets or the second, third and fourth sets only.

Returning now to FIG. 1, the base configuration of a double-ended tuning fork quartz crystal will have some effect on the crystal parameters because of the change of the boundary condition between the motion of the tines and the coupling of the base. Experiments were performed to investigate the effect of the base shoulder width $d_1$ and $d_2$ near the crystal crotch areas. There are basically two cases: $d_1=d_2$ and $d_2=0$. These experiments show that the base configuration has a significant effect on the frequency-force relation. The base configuration not only affects the frequency force relation, but also the linearity of the frequency force relation, especially when the external force is very small. The external force will shift the effecttive stress nodal line of the flexural motion of the crystal in the lateral direction, especially when the base to the tines configuration is not symmetrical. Thus, these experiments have shown that the value of the frequency-force relation tends to decrease and is less than its theoretical value if $d_1$ or $d_2$ is not near or equal to $d_c$. Thus, it is the teaching of the present invention to provide a double-ended tuning fork as shown in FIG. 1, where $d_1=d_2=d_c$.

It can therefore be seen that according to the present invention, there is disclosed different designs and different results achievable using a double-ended tuning fork quartz crystal vibrating in the fundamental and overtone flexure modes. Such a crystal is not only useful as a force sensor, but is also useful in frequency control and filter applications.

While the invention has been described with respect to the preferred physical embodiments constructed in accordance therewith, it will be apparent to those skilled in the art that various modifications and improvements may be made without departing from the scope and spirit of the invention. Accordingly, it is to be understood that the invention is not to be limited by the specific illustrative embodiments, but only by the scope of the appended claims.

I claim:

1. In a quartz crystal microresonator of the type including first and second stem portions, a pair of integral tines extending between said stem portions, a slot between said tines, said slot having opposed crotches where said tines join said stem portions, and a plurality of electrodes mounted on each of said tines, spaced along the length thereof, said electrodes being adapted for receipt of an AC voltage for causing said tines to oscillate, the improvement wherein the crystal orientation is (ZYw) $\theta$ and said electrodes are mounted onn said tines such that the polarity of the electrodes changes along the length of the tines at points derived by determining where the second derivative of the lateral displacement of the tines with respect to length changes polarity.

2. In a quartz crystal microresonator according to claim 1, the improvement wherein each of said tines has plural sets of electrodes mounted thereon, each set including four electrodes mounted on the top, bottom and side surfaces of said tine.

3. In a quartz crystal microresonator according to claim 2, the improvement wherein said microresonator is operated in the fundamental mode and wherein the polarity of said electrodes changes twice along the length of said tines.

4. In a quartz crystal microresonator according to claim 3, the improvement wherein there are three sets of electrodes spaced along each of said tines.

5. In a quartz crystal microresonator according to claim 2, the improvement wherein said microresonator is operated in the first overtone mode and wherein the polarity of said electrodes changes three times along the length of said tines.

6. In a quartz crystal microresonator according to claim 5, the improvement wherein there are four sets of electrodes spaced along each of said tines.

7. In a quartz crystal microresonator according to claim 2, the improvement wherein said microresonator is operated in the second overtone mode and wherein the polarity of said electrodes changes four times along the length of said tines.

8. In a quartz crystal microresonator according to claim 7, the improvement wherein there are five sets of electrodes spaced along each of said tines.

9. In a quartz crystal microresonator according to claim 1, the improvement wherein each of said tines has a pair of opposed shoulders where said tines join said stem portions and wherein the widths of said shoulders at said opposite ends of said tines are approximately equal and approximately equal to one-half of the width of said crotches.

10. In a quartz crystal microresonator according to claim 1, the improvement wherein $\theta$ is within the range $\pm 20°$.

11. In a quartz crystal microresonator of the type including first and second stem portions, a pair of integral tines extending between said stem portions, a slot between said tines, said slot having opposed crotches where said tines join said stem portions and a plurality of electrodes mounted on each of said tines, spaced along the length thereof, said electrodes being adapted for receipt of an AC voltage for causing said tines to oscillate, the improvement wherein each of said tines has a pair of opposed shoulders where said tines join said stem portions and wherein the widths of said shoulders at said opposite ends of said tines are approximately equal and approximately equal to one-half of the width of said crotches.

* * * * *